United States Patent [19]
Taira

[11] 4,449,158
[45] May 15, 1984

[54] INPUT PROTECTION CIRCUIT FOR MIS TRANSISTOR

[75] Inventor: Shigenobu Taira, Aizuwakamatsu, Japan

[73] Assignee: Fujitsu Limited, Kawasaki, Japan

[21] Appl. No.: 327,693

[22] Filed: Dec. 4, 1981

[30] Foreign Application Priority Data

Dec. 26, 1980 [JP] Japan ................ 55-186868

[51] Int. Cl.³ ............................................. H02H 9/04
[52] U.S. Cl. .................... 361/91; 307/200 B; 357/23
[58] Field of Search ................ 361/56, 91, 110, 111; 307/200 A, 200 B; 357/23.6 P

[56] References Cited

U.S. PATENT DOCUMENTS 3,636,385  1/1972  Koepp .................. 307/200 B X
4,061,928  12/1977  Kessler ................... 307/200 B

*Primary Examiner*—Reinhard J. Eisenzopf
*Attorney, Agent, or Firm*—Staas & Halsey

[57] ABSTRACT

An input protection circuit which protects the gate of a MIS transistor from breakdown due to an excessively high voltage being applied thereto. The input protection circuit includes a first resistor and a second resistor connected in series between a input terminal and a gate of the MIS transistor, a first protection transistor provided between a first connecting point between the first and second resistors and one side of the power supply, and a second protection transistor provided between a second connecting point between the second resistor and the gate of the MIS transistor the other side of the power supply. The first protection transistor has a large mutual conductance gm, while the second protection transistor has a low breakdown voltage. With this input protection circuit, even when the gate breakdown voltage of the transistor to be protected is lower than the breakdown voltage of the first protection transistor, the gate electrode is kept at a voltage lower than the gate breakdown voltage by means of the second protection transistor having a lower breakdown voltage.

7 Claims, 9 Drawing Figures

INPUT PROTECTION CIRCUIT FOR MIS TRANSISTOR

BACKGROUND OF THE INVENTION

1. Field of the Invention

The present invention relates to an input protection circuit which prevents an excessive voltage such as a static charge from being applied to the gate of a MIS (Metal Insulator Semiconductor) type transistor provided on the surface of a semiconductor substrate.

2. Description of the Prior Art

In a semiconductor integrated circuit comprising a MIS transistor, the gate of the MIS transistor is connected to an input terminal. The insulating film between the gate electrode of the MIS transistor and the substrate is very thin. Therefore, when an excessive voltage is applied to the gate electrode from the input terminal, gate breakdown, for example, a short-circuit between the gate and source, occurs.

Unwanted excessive voltage is likely to be applied through handling in the manufacturing process. Static charges in particular result from handling by people.

It is impossible to realize an environment which is not occupied by static charges, and thus the integrated circuit of a MIS transistor is usually provided with an input protection circuit to be connected to the input terminal.

The ordinary input protection circuit comprises a resistor and a protection transistor. A resistor is connected between the input terminal and the gate of the MIS transistor, and the drain of the protection transistor is connected to the gate of the MIS transistor to be protected, while the source is connected to the ground line, respectively. This protection transistor is a field transistor having a thicker gate insulation film than that of an ordinary MIS transistor and is the same as an NPN lateral transistor (Drain (N)-channel (P)-source (N)) in operation. The breakdown voltage of this protection transistor is determined by the PN junction breakdown voltage between the drain and channel.

For years, continuous efforts in semiconductor integrated circuits have been oriented to the realization of higher integration density, and this tends to make the gate insulation film of the MIS transistor thinner, resulting in lower gate breakdown voltages. If the gate breakdown voltage becomes lower than that (PN junction breakdown voltage) of the protection transistor, the protection function of the conventional protection transistor is no longer effective.

SUMMARY OF THE INVENTION

It is an object of the present invention to provide an input protection circuit which prevents application of unwanted excessive voltage to a MIS transistor.

It is another object of the present invention to provide an input protection circuit which protects the MIS transistor from gate breakdown which may occur when the unwanted excessive voltage is applied to the gate of the MIS transistor having a thin gate insulation film.

According to the present invention, there is provided an input protection circuit, formed on a substrate and connected to a main circuit MIS transistor to be protected from a high voltage, comprising:

a first impedance element and a second impedance element, connected in series between an input terminal and the main circuit MIS transistor;

a first protection means, having a first breakdown voltage and connected between a power supply and a first connecting point at which the first and second impedance elements are connected; and a second protection means, having a second breakdown voltage lower than the breakdown voltage of said main circuit MIS transistor and connected between the power supply and a second connecting point at which the second impedance element and the main circuit MIS transistor are connected.

DESCRIPTION OF THE PREFERRED EMBODIMENT

Figure 1:
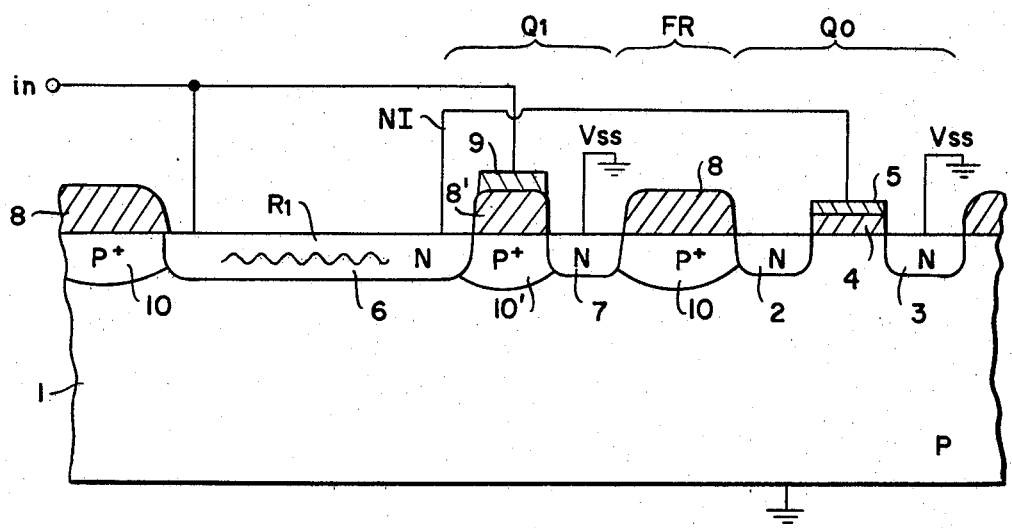
FIG. 1 is a sectional view of the conventional input protection circuit structure.
Figure 2:
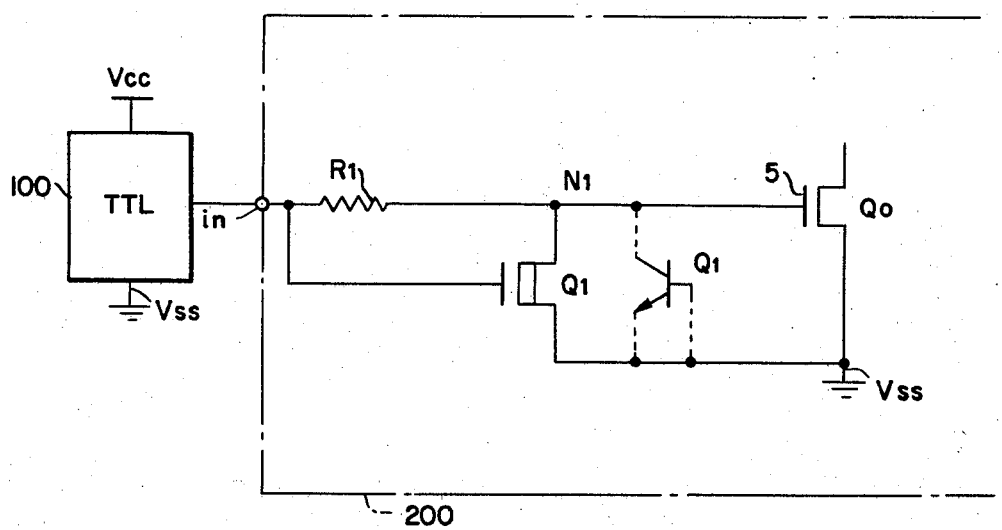
FIG. 2 is the equivalent circuit for the conventional input protection electrical circuit structure of FIG. 1.

FIG. 1 outlines in a sectional view the structure of a conventional MIS transistor and the input protection circuit which protects the gate of such transistor, and FIG. 2 shows the equivalent circuit schematic of the FIG. 1 sectional view. In this figure, 1 is a P type semiconductor substrate having a MIS type transistor $Q_0$ formed thereon, and includes a N type drain 2, a source 3, a gate insulating film 4, and a gate electrode 5 which is to be protected. The gate electrode 5 is indirectly connected to an input terminal "in". The protection circuit, consisting of and impedance element, the resistor $R_1$, and the protection transistor $Q_1$, is provided for such gate electrode.

The resistor $R_1$ consists of an N type diffusion layer 6 and the protection transistor $Q_1$ is a field transistor consisting of a thick insulating film 8', as in the case of the insulating film 8 of the other field part FR, and the electrode 9 formed thereon, with the N type diffusion layer 6 working as the drain and the diffusion layer 7 as the source. The P+ region 10, with a higher impurity concentration than the substrate, is provided for the channel cut under the field insulation film 8, and the P+ region 10' is also provided as a part of the field transistor $Q_1$.

The input terminal "in" is ordinarily connected to the external TTL circuit 100, etc. The portion in FIG. 2 indicated by the dash-and-dot line is the semiconductor integrated circuit 200 having the protection transistor.

Figure 3:
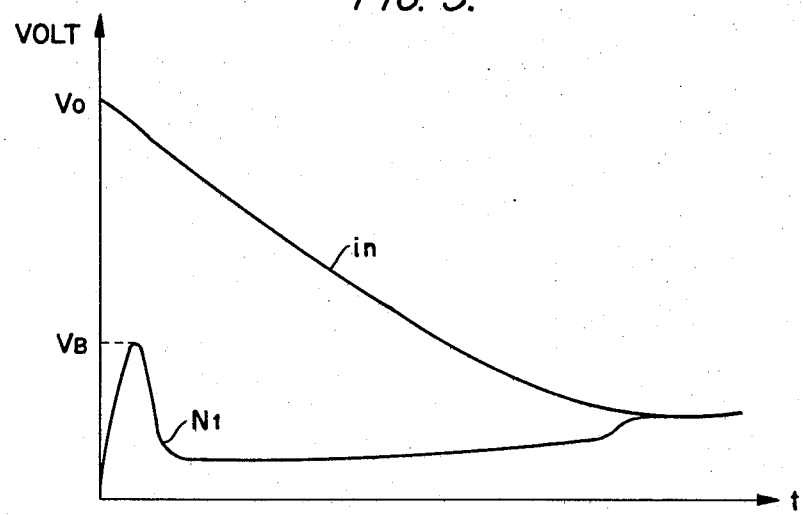
FIG. 3 is a timing chart diagram indicating the operation of the structure and circuit of FIGS. 1, 2.

The protection circuit is provided for protecting the gate of transistor $Q_0$ from breakdown when an excessively high voltage is applied to the input terminal "in". As such an excessively high voltage, the static charge generated by working personnel is considered. In such a case, the device 200 is not connected to the TTL circuit 100, etc. Therefore, the protection operation for an excessively high voltage applied to the input terminal "in" is explained in accordance with the time chart for the potentials of the input terminal "in" and terminal N1 indicated in FIG. 3.

When an excessively high voltage $V_0$ is applied to the input terminal "in", the voltage at the terminal N1 (the voltage to be applied to the gate 5) is raised immediately. Then, when the potential at terminal N1 exceeds the breakdown voltage $V_B$ of the protection transistor $Q_1$, which is a field transistor, the transistor $Q_1$ turns ON, allowing conduction between the terminal N1 and ground line $V_{ss}$. As a result, an excessively high voltage applied to the input terminal "in" is absorbed by the ground side via the transistor $Q_1$ and the potential at terminal N1 falls. The potential of input terminal "in" also falls, the transistor $Q_1$ turns OFF and returns to the ordinary operation. In the ordinary operation, only signals having the external TTL level are applied to the input terminal "in" and therefore the voltage at gate 5 does not become higher than the breakdown voltage of the protection transistor $Q_1$ and the transistor $Q_1$ is always OFF.

This protection transistor $Q_1$ is a field transistor, but the parasitic NPN lateral transistor $Q_1$ actually operates. The breakdown voltage $V_B$ is therefore equal to the PN junction breakdown voltage between the P+ type layer 10' and the N type diffusion layer 6. When the transistor $Q_1$ once turns ON, it absorbs a large amount of charge because its mutual conductance gm is sufficiently large.

Meanwhile, if the gate insulating film (oxide film) 4 of the conventional MIS transistor $Q_0$ is as thick as about 1000 Å, the gate breakdown voltage is as high as about 80 V. On the other hand, the concentration of the P+ type layer 10' is restriced because this layer is formed with the same process as that for the P+ type layer 10 for the channel cut, and the breakdown voltage $V_B$ which is equal to the breakdown voltage the protection circuit is fixed, for example, at the value of about 35 V. Until the gate breakdown voltage is as high as 80 V, it functions effectively as the protection circuit; however, recently higher integration of the elements of integrated circuits requires that the gate insulating film 4 become as thin as 400 Å and, do a result, the gate breakdown voltage is lowered to as low as about 30 to 35 V. Thereby, a protection transisor having a breakdown voltage of 35 V can no longer function effectively as the protection transistor. Of course, it is possible to lower the breakdown voltage $V_B$ by controlling individually the concentration of the P+ layer 10' and the other P+ layer 10 for the channel cut. But for this purpose, an exclusive injection process using an exclusive mask is required and it is no longer practical.

The input protection circuit of the present invention can protect the transistor $Q_0$ to be protected even if the gate breakdown voltage ($V_{GB}$) of such transistor is lower than the breakdown voltage of transistor $Q_1$.

Figure 5:
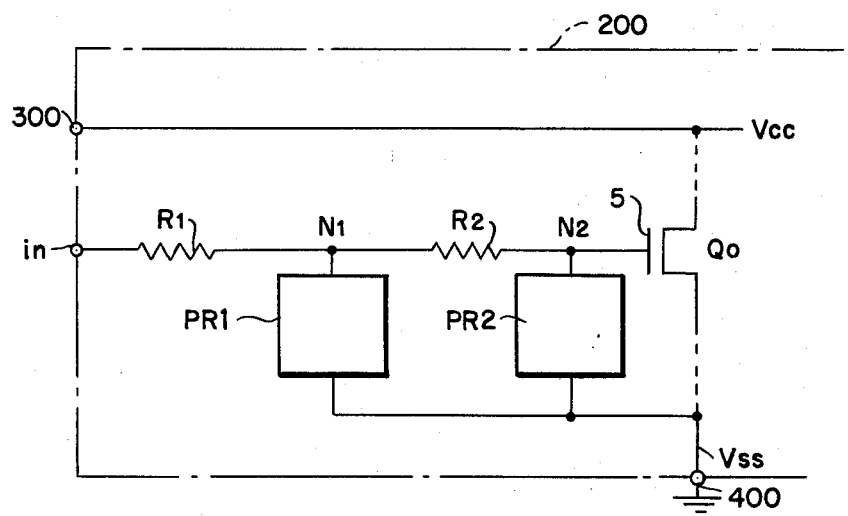
FIG. 5 is another block diagram of the present invention.
Figure 6:
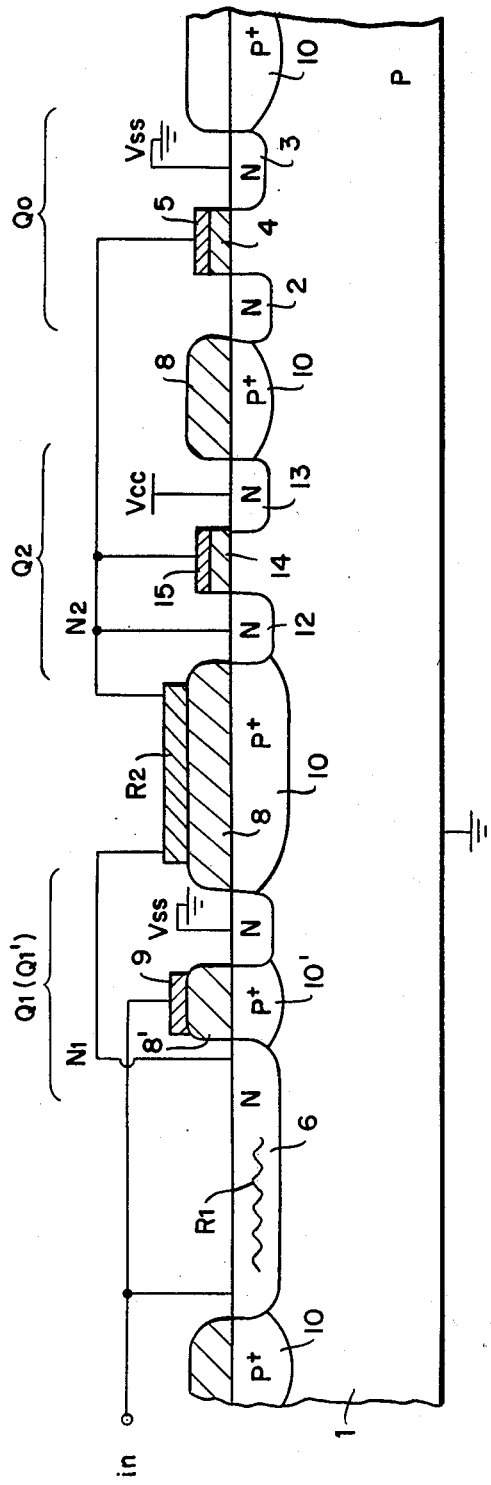
FIG. 6 is a sectional view of an embodiment of the input protection circuit of the present invention.

FIG. 5 and FIG. 6 are block diagrams indicating an embodiment of the present invention. The gate 5 of the transistor $Q_0$ to be protected provided in the integrated circuit 200 is connected to the input terminal "in" via the resistor $R_1$, which is the first impedance element, and the resistor $R_2$, which is the second impedance element. 300 is the high power supply terminal; 400 is the lower power supply terminal, namely the ground power supply terminal. The first protection means PR1 is connected between the first connecting point N1 and the power supply, while the second protection means PR2 is connected between the second connecting point N2 and the power supply, respectively.

The first protection means PR1 has a high breakdown voltage but a small impedance Z1 when it turns ON and is capable of conducting excessive static charge applied to the input terminal to the ground power supply $V_{ss}$ in large amounts.

The second protection means PR2 has a large impedance Z2 when it turns ON and cannot absorb a large amount of static charge but has a breakdown voltage which is sufficiently lower than the gate breakdown voltage $V_{GB}$ of the transistor $Q_0$. Therefore, this protection means can compensate for the disadvantage that the first protection means PR1 has a high breakdown voltage.

Figure 4:
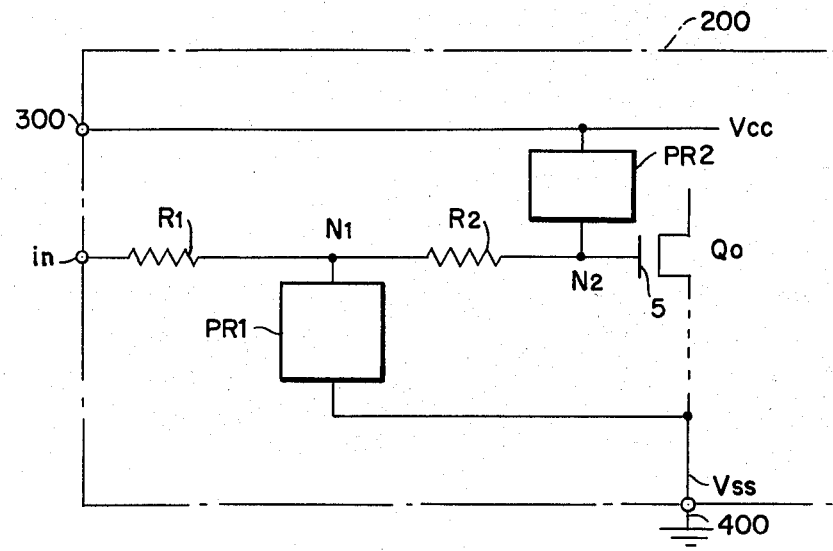
FIG. 4 is a block diagram of the present invention.

FIG. 4 shows the second protection means PR2 being connected to the high power supply $V_{cc}$. In FIG. 5, the second protection means PR2 is connected to the ground power supply $V_{ss}$.

FIG. 6 shows in a cross-sectional view the practical input protection circuit of the present invention.

Figure 7:
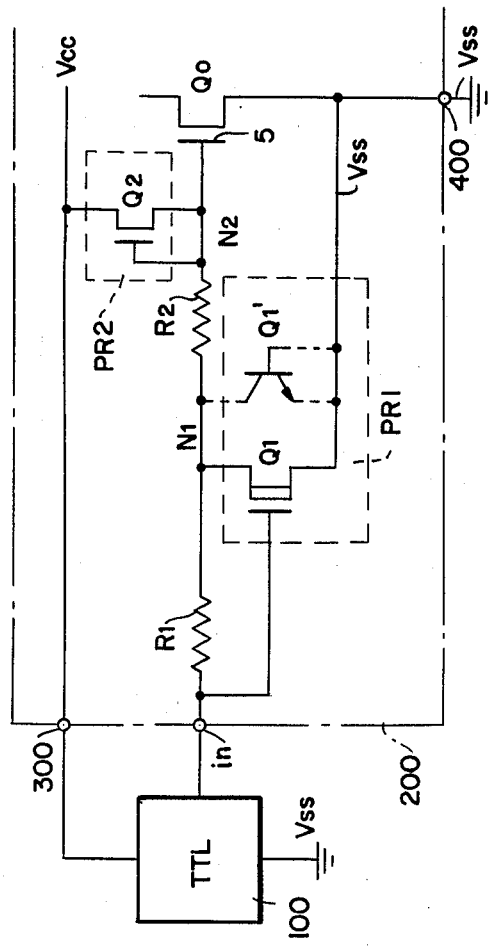
FIG. 7 is the equivalent circuit for the input protection electrical circuit of the embodiment of FIG. 6.

FIG. 6 is a cross-sectional view of the practical input protection circuit of the present invention, while FIG. 7 is the equivalent circuit thereof. The same portions as those in FIG. 1 and FIG. 2 are given the same symbols. In this embodiment, the first and second resistors $R_1$ and $R_2$ are connected in series between the gate electrode 5 of the MIS transistor $Q_0$ to be protected and the input terminal "in". The first protection transistor $Q_1$ is provided between the first connecting point N1 and the ground power supply $V_{ss}$, while the second protection transistor $Q_2$ is between the second connecting point N2 and the high power supply $V_{cc}$.

The structures of the first resistor $R_1$ and the first protection transistor $Q_1$ are the same as those of FIGS. 1 and 2. The second resistor $R_2$ is composed of a polycrystalline silicon layer, while the second protection transistor $Q_2$ has the same structure and characteristics as those of the main circuit MIS transistor $Q_0$ provided within the integrated circuit device 200. Therefore, the breakdown voltage $V_B$ of the transistor $Q_1$ is equal to the PN junction breakdown voltage (about 35 V) between the drain region 6 and channel region 10'. Meanwhile, the breakdown voltage of transistor $Q_2$ is equal to the threshold voltage $V_{th}$ of the MIS transistor. This is because the potential at the power supply terminals 300 and 400, which are in the floating condition during the handling in the manufacturing process, is usually 0 V (ground level).

Figure 8:
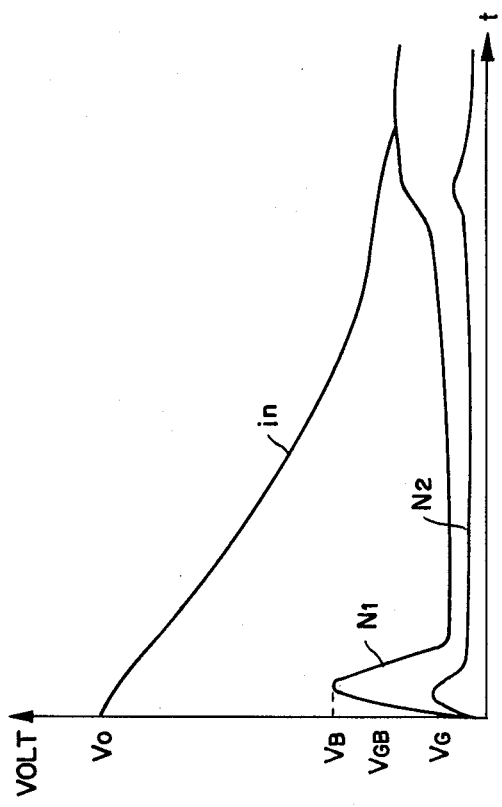
FIG. 8 is a timing chart diagram indicating the operation of the structure and circuit FIGS. 6 and 7.

The operation of the input protection circuit is explained in detail in accordance with the timing chart of FIG. 8. $V_0$ is an excessive voltage applied to the input terminal "in"; $V_B$ is the breakdown voltage of transistor $Q_1$; $V_G$ is the maximum voltage level to be applied to the gates of transistors $Q_2$ and $Q_0$; $V_{GB}$ is the gate breakdown voltage of transistor $Q_0$ to be protected; "in" is the potential at the input terminal "in"; and $N_1$ and $N_2$ are potentials at the first and second connecting points, respectively.

When an excessively high voltage $V_0$, for example, 500 to 1000 volts, is applied momentarily to the input terminal "in", the potential of the first and second connecting points $N_1$ and $N_2$ also increases immediately. When the potential at the second connecting point $N_2$ exceeds the breakdown voltage of transistor $Q_2$ (threshold voltage of about 1 V), the transistor $Q_2$ turns ON. The mutual conductance gm of the transistor $Q_2$ is small, but the ON resistance $Z_2$ thereof is large as compared with that of the field transistor $Q_1$. Therefore, a minute current (several mA) flows into the transistor $Q_2$ and thus it cannot absorb a large amount of static charge. However, the potential at the connecting points $N_1$ and $N_2$ becomes equal to a level divided from $V_0$ by resistance determined by the resistors $R_1$ and $R_2$ and $\beta$ of the transistor $Q_2$. Therefore, the potential level at the connecting point $N_2$ is $V_G$, even at most, and does not exceed the gate breakdown voltage $V_{GB}$ (20 to 30 V) until the transistor $Q_1$ turns ON.

After a while, the transistor $Q_1$ turns ON when the potential level at the connecting point $N_1$ becomes higher than $V_B$, allowing a heavy current (several A) to flow and thereby effectively absorbing a large amount of static charge. Therefore, the gate 5 is kept at a level under the voltage $V_G$ which is lower than the gate breakdown voltage $V_{GB}$, and thus gate breakdown can be prevented.

If the transistor $Q_1$ is not provided the potential at the connecting point $N_2$ increases more than $V_G$ because the mutual inductance gm is small, namely the impedance $Z_2$ is large even when the transistor $Q_2$ turns ON, and after a while, such potential exceeds the gate breakdown voltage $V_{GB}$ resulting in gate breakdown at the transistor $Q_0$.

Moreover, the second protection transistor $Q_2$ does not turn ON during ordinary operation, resulting in no problem. Namely, since only a level (under $V_{cc}$) as low as the TTL level is applied to the input terminal "in", the gate of transistor $Q_2$ is always lower than the power supply line $V_{cc}$ of the source and is at the same level as the drain. As a result, the second protection transistor $Q_2$ does not turn ON.

A practical design example is indicated below. When $V_B = 35$ V and $R_2 = 500$ ohms, and the current flowing while the transistor $Q_2$ turns ON, when $V_G$ is applied to the gate of such transistor, is considered as 50 mA, the voltage drop due to the resistor $R_2$ becomes 25 V (500 ohms$\times$0.06A=25 V). Therefore, $V_G = 35$ V$-25$ V$=10$ V. Moreover, $Q_2$ is designed as follow so that $V_G$ becomes 10 V, while $I_D$ becomes 50 mA.

$$I_D = B/2(V_G - V_{th})^2$$

(Where, $I_D$ is the drain current and $V_{th}$ is a threshold voltage)

Therefore, if $V_{th}$ is 1.0 V, $$\beta = 1234 \ \mu A/V^2$$

As for the size of $Q_2$ in order to realize such characteristics, the relation between the channel width W and channel length L becomes as follows with the film thickness of the insulating film being considered as 400Å.

$$W/L = 60\mu/3\mu.$$

This value is almost the same as that of the ordinary MIS transistor.

Figure 9:
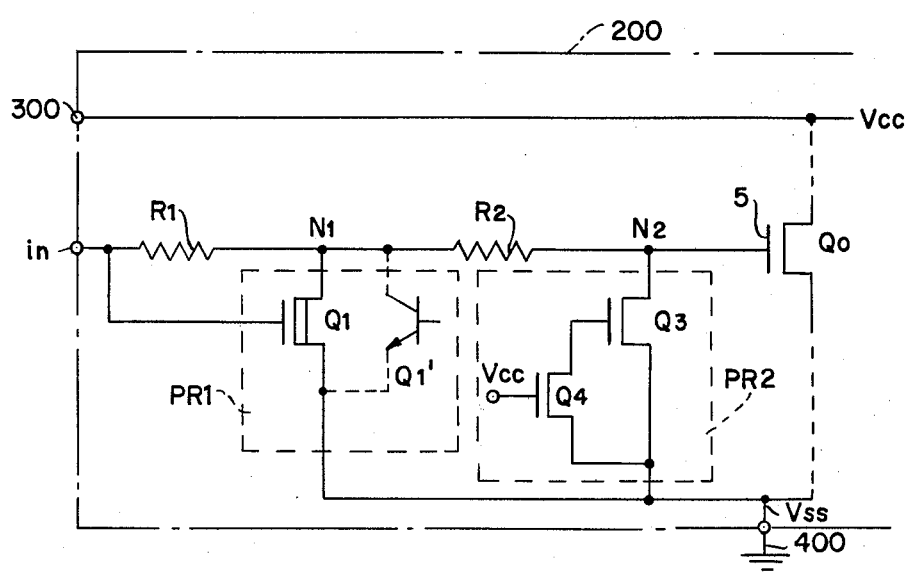
FIG. 9 is another embodiment of the input protection circuit of the present invention.

FIG. 9 is the schematic diagram of an other embodiment of the present invention. In this embodiment, the second protection means $PR_2$ is provided between the second connecting point $N_2$ and the ground power supply V. The second protection means comprises a second protection transistor $Q_3$ having a drain which is connected to the connecting point $N_2$, a source which is connected to the ground power supply and a gate which is connected to the ground power supply via the transistor $Q_4$.

Since high power supply $V_{cc}$ is about 0 V during the handling in the manufacturing process, the transistor $Q_4$ is always in the OFF condition. As a result, when an excessively high voltage $V_0$ is applied to the input terminal "in" and the level at the second connecting point $N_2$ rises, the gate potential of the transistor increases due to the capacitive coupling between the drain and gate. After a while, when the potential between the gate and source (ground) exceeds the threshold voltage, the transistor $Q_3$ turns ON. Therefore, the breakdown voltage of the second protection means $PR_2$ is almost equal to the threshold voltage of the transistor $Q_3$. The transistors $Q_3$ and $Q_4$ provide the same structure and characteristics as those of the MIS transistor of the main circuit in the device 200.

Even when the transistor $Q_3$ turns ON, a current flowing therein is of low level and cannot sufficiently absorb the static charge and therefore the level of $N_2$ tends to increase. When the transistor $Q_1$ turns ON, a large amount of static charge is absorbed and the level at connecting point $N_2$, namely the gate voltage of the transistor $Q_0$, is kept at a value lower than $V_g$ which is also lower than the gate breakdown voltage $V_{GB}$.

As explained above in detail, the present invention provides an input protection circuit which can effectively protect the gate of a MIS transistor having a thin gate insulating film from breakdown. Moreover, the input protection circuit of the present invention is simply realized without adding any modifications to the conventional manufacturing process.

We claim:

1. An input protection circuit formed on a substrate and connected to a main circuit MIS transistor having a first breakdown voltage, said MIS transistor to be protected from a high voltage applied to an input terminal, said protection circuit comprising:
    receiving means for receiving supply voltage;
    a first impedance element operatively connected to said input terminal;
    a second impedance element operatively connected in series to said first impedance element at a first connecting point and operatively connected to said main circuit MIS transistor at a second connecting point;
    first protection means, having a second breakdown voltage greater than said first breakdown voltage and a first mutual conductance, said first protection means including a first transistor and being operatively connected between said receiving means and said first connecting point, for preventing excess voltage at said main circuit MIS transistor; and
    second protection means, having an ON and an OFF state, a third breakdown voltage lower than said first breakdown voltage, a second mutual conductance less than said first mutual conductance, said second protection means being operatively connected between said receiving means and said second connecting point at which said second impedance element and said main circuit MIS transistor are connected, for preventing excess voltage at said main circuit MIS transistor;
    wherein said second impedance element has an impedance selected such that said second connecting point is at a voltage less than said first breakdown voltage when said second protection means is in said ON state.

2. An input protection circuit as set forth in claim 1, wherein said main circuit MIS transistor comprises a gate connected through said first and second impedance elements to said input terminal, and said first breakdown voltage is the gate breakdown voltage which causes damage to said gate.

3. An input protection circuit as set forth in claim 1, wherein said first transistor comprises:
   a gate operatively connected to said input terminal;
   a first diffusion region formed in said substrate and connected to said first connecting point;
   a channel region, having an impurity type which is opposite to that of said first diffusion region, formed in said substrate contiguous to said first diffusion region; and
   a second diffusion region, having an impurity type which is the same as that of said first diffusion region, formed in said substrate contiguous to said channel region and connected to the ground side of said receiving means;
   wherein the impurity concentration of said first and second diffusion regions is the same as that of one of the drain and source regions of said main circuit MIS transistor.

4. An input protection circuit as set forth in claim 1, wherein said second transistor comprises:
   one of a source region and a drain region connected to said second connecting point;
   the other of said drain region and source region connected to the ungrounded side of said receiving means; and
   a gate connected to said second connecting point;
   wherein the threshold voltage of said second transistor is the same as that of said main circuit MIS transistor.

5. An input protection circuit as set forth in claim 1, wherein
   said second transistor comprises:
      one of a source region and a drain region connected to said second connecting point; and
      the other of said drain region and said source region connected to the ground side of said receiving means;
      wherein the threshold voltage of said second transistor is the same as that of said main circuit MIS transistor.

6. An input protection circuit as set forth in claim 1, wherein
   said first impedance element comprises a diffusion region formed in said substrate.

7. An input protection circuit as set forth in claim 1, wherein
   said second impedance element comprises a polycrystalline silicon layer.

* * * * *